(12) United States Patent
Van Aerde et al.

(10) Patent No.: US 9,837,271 B2
(45) Date of Patent: *Dec. 5, 2017

(54) PROCESS FOR FORMING SILICON-FILLED OPENINGS WITH A REDUCED OCCURRENCE OF VOIDS

(71) Applicant: ASM IP Holding B.V., Almere (NL)

(72) Inventors: Steven R. A. Van Aerde, Tielt-Winge (BE); Cornelius A. van der Jeugd, Heverlee (BE); Theodorus G. M. Oosterlaken, Oudewater (NL); Frank Huussen, Bilthoven (NL)

(73) Assignee: ASM IP HOLDING B.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/941,322

(22) Filed: Nov. 13, 2015

(65) Prior Publication Data

US 2016/0141176 A1    May 19, 2016

Related U.S. Application Data

(63) Continuation-in-part of application No. 14/335,446, filed on Jul. 18, 2014, now Pat. No. 9,443,730, and a
(Continued)

(51) Int. Cl.
  *H01L 21/20* (2006.01)
  *H01L 21/36* (2006.01)
  (Continued)

(52) U.S. Cl.
  CPC ...... *H01L 21/02669* (2013.01); *C23C 16/045* (2013.01); *C23C 16/24* (2013.01);
  (Continued)

(58) Field of Classification Search
  CPC .......... H01L 21/0243; H01L 21/02532; H01L 21/02592; H01L 21/0262; H01L 21/02669; H01L 21/32055; H01L 21/76877
  (Continued)

(56) References Cited

U.S. PATENT DOCUMENTS

| 3,900,597 A | 8/1975 | Chruma et al. |
| 4,062,707 A | 12/1977 | Mochizuki et al. |

(Continued)

FOREIGN PATENT DOCUMENTS

| EP | 0 634 785 | 1/1995 |
| EP | 0 933 804 A2 | 12/1998 |

(Continued)

OTHER PUBLICATIONS

Arienzo et al., "In Situ Arsenic-Doped Polysilicon for VLSI Applications," *Transactions on Electron Devices* ED33(1):1535-1538 (1986).

(Continued)

*Primary Examiner* — Duy T Nguyen
(74) *Attorney, Agent, or Firm* — Knobbe, Martens, Olson & Bear LLP (57) ABSTRACT

In some embodiments, silicon-filled openings are formed having no or a low occurrence of voids in the silicon fill, while maintaining a smooth exposed silicon surface. In some embodiments, an opening in a substrate may be filled with silicon, such as amorphous silicon. The deposited silicon may have interior voids. This deposited silicon is then exposed to a silicon mobility inhibitor, such as an oxygen-containing species and/or a semiconductor dopant. The deposited silicon fill is subsequently annealed. After the anneal, the voids may be reduced in size and, in some (Continued)

embodiments, this reduction in size may occur to such an extent that the voids are eliminated.

26 Claims, 8 Drawing Sheets

Related U.S. Application Data continuation-in-part of application No. 14/555,379, filed on Nov. 26, 2014, now abandoned, which is a continuation-in-part of application No. 14/335,446, filed on Jul. 18, 2014, now Pat. No. 9,443,730.

(51) Int. Cl.
    *H01L 21/02* (2006.01)
    *C23C 16/24* (2006.01)
    *C23C 16/04* (2006.01)
    *C23C 16/56* (2006.01)
    *H01L 21/768* (2006.01)
    *H01L 21/285* (2006.01)

(52) U.S. Cl.
    CPC .......... *C23C 16/56* (2013.01); *H01L 21/0243* (2013.01); *H01L 21/0262* (2013.01); *H01L 21/02532* (2013.01); *H01L 21/02592* (2013.01); *H01L 21/28525* (2013.01); *H01L 21/76877* (2013.01); *H01L 21/76883* (2013.01)

(58) Field of Classification Search
    USPC ........................................................ 438/486
    See application file for complete search history.

(56) References Cited

U.S. PATENT DOCUMENTS

| | | | |
|---|---|---|---|
| 4,217,374 A | 8/1980 | Ovshinsky et al. |
| 4,237,150 A | 12/1980 | Wiesmann |
| 4,341,818 A | 7/1982 | Adams et al. |
| 4,379,020 A | 4/1983 | Glaeser et al. |
| 4,404,236 A | 9/1983 | Komatsu et al. |
| 4,444,812 A | 4/1984 | Gutsche |
| 4,466,922 A | 8/1984 | Weitz et al. |
| 4,592,933 A | 6/1986 | Meyerson et al. |
| 4,634,605 A | 1/1987 | Wiesmann |
| 4,745,088 A | 5/1988 | Inoue et al. |
| 4,829,017 A | 5/1989 | Malhi |
| 4,834,020 A | 5/1989 | Bartholomew et al. |
| 4,843,022 A | 6/1989 | Yamazaki |
| 4,963,506 A | 10/1990 | Liaw et al. |
| 5,013,691 A | 5/1991 | Lory et al. |
| 5,017,308 A | 5/1991 | Iijima et al. |
| 5,037,666 A | 8/1991 | Mori |
| 5,065,273 A | 11/1991 | Rajeevakumar |
| 5,075,749 A | 12/1991 | Chi et al. |
| 5,080,933 A | 1/1992 | Grupen-Shemansy et al. |
| 5,082,696 A | 1/1992 | Sharp |
| 5,097,381 A | 3/1992 | Vo |
| 5,192,708 A | 3/1993 | Beyer et al. |
| 5,198,387 A | 3/1993 | Tang |
| 5,250,452 A | 10/1993 | Ozturk et al. |
| 5,254,369 A | 10/1993 | Arai et al. |
| 5,256,588 A | 10/1993 | Witek et al. |
| 5,266,526 A | 11/1993 | Aoyama |
| 5,290,358 A | 3/1994 | Rubloff et al. |
| 5,298,790 A | 3/1994 | Harmon et al. |
| 5,310,698 A | 5/1994 | Wild |
| 5,314,845 A | 5/1994 | Lee et al. |
| 5,324,684 A | 6/1994 | Kermani et al. |
| 5,326,722 A | 7/1994 | Huang |
| 5,371,039 A | 12/1994 | Ogaro |
| 5,525,540 A | 6/1996 | Zenke et al. |
| 5,576,059 A | 11/1996 | Beinglass et al. |
| 5,593,727 A | 1/1997 | Desu et al. |
| 5,607,511 A | 3/1997 | Meyerson |
| 5,607,724 A | 3/1997 | Beinglass et al. |
| 5,614,257 A | 3/1997 | Beinglass et al. |
| 5,627,092 A | 5/1997 | Alsmeier et al. |
| 5,635,242 A | 6/1997 | Agnello et al. |
| 5,677,219 A | 10/1997 | Mazure et al. |
| 5,695,819 A | 12/1997 | Beinglass et al. |
| 5,700,520 A | 12/1997 | Beinglass et al. |
| 5,753,526 A | 5/1998 | Ozaki |
| 5,786,027 A | 7/1998 | Rolfson |
| 5,838,045 A | 11/1998 | Muller et al. |
| 5,863,598 A | 1/1999 | Venkatesan et al. |
| 5,874,129 A | 2/1999 | Beinglass et al. |
| 5,876,797 A | 3/1999 | Beinglass et al. |
| 5,888,876 A * | 3/1999 | Shiozawa ............. H01L 21/763 257/E21.396 |
| 5,888,906 A | 3/1999 | Sandhu et al. |
| 5,905,279 A | 5/1999 | Nitayama et al. |
| 5,910,019 A | 6/1999 | Watanabe et al. |
| 5,913,125 A | 6/1999 | Brouillette |
| 5,972,116 A | 10/1999 | Takagi |
| 6,004,029 A | 12/1999 | Moslehi |
| 6,022,806 A | 2/2000 | Sato et al. |
| 6,057,216 A | 5/2000 | Economikos et al. |
| 6,067,680 A | 5/2000 | Pan et al. |
| 6,121,081 A | 9/2000 | Thakur |
| 6,150,686 A | 11/2000 | Sigiura et al. |
| 6,204,206 B1 | 3/2001 | Hurley |
| 6,232,196 B1 | 5/2001 | Raaijmakers et al. |
| 6,297,088 B1 | 10/2001 | King |
| 6,306,761 B1 | 10/2001 | Taguchi |
| 6,461,437 B1 | 10/2002 | Kubota |
| 6,489,066 B2 | 12/2002 | Mirkanimi |
| 6,809,005 B2 | 10/2004 | Ranade et al. |
| 6,861,334 B2 | 3/2005 | Raaijmakers et al. |
| 7,087,536 B2 | 8/2006 | Nemani et al. |
| 7,157,327 B2 | 1/2007 | Haupt |
| 7,288,463 B1 | 10/2007 | Papassouliotis |
| 8,076,251 B2 | 12/2011 | Akae et al. |
| 8,187,948 B2 | 5/2012 | Chen et al. |
| 8,415,258 B2 | 4/2013 | Akae et al. |
| 8,592,005 B2 | 11/2013 | Ueda |
| 8,664,127 B2 | 3/2014 | Bhatia et al. |
| 8,722,510 B2 | 5/2014 | Watanabe et al. |
| 8,945,305 B2 | 2/2015 | Marsh |
| 8,945,339 B2 | 2/2015 | Kakimoto et al. |
| 9,023,738 B2 | 5/2015 | Kato et al. |
| 9,190,264 B2 | 11/2015 | Yuasa et al. |
| 9,257,274 B2 | 2/2016 | Kang et al. |
| 2002/0139775 A1 | 10/2002 | Chang |
| 2005/0112282 A1 | 5/2005 | Gordon et al. |
| 2006/0046518 A1 | 3/2006 | Hill et al. |
| 2007/0026651 A1* | 2/2007 | Leam ................. H01L 21/28273 438/552 |
| 2008/0185635 A1 | 8/2008 | Yanagi |
| 2008/0242097 A1 | 10/2008 | Boescke et al. |
| 2011/0049461 A1* | 3/2011 | Breitwisch ........ H01L 21/31144 257/3 |
| 2012/0149213 A1 | 6/2012 | Nittala |
| 2013/0005142 A1 | 1/2013 | Kakimoto et al. |
| 2013/0105796 A1 | 5/2013 | Liu et al. |
| 2014/0179085 A1 | 6/2014 | Hirose et al. |
| 2014/0193983 A1 | 7/2014 | Lavoie |
| 2014/0256156 A1 | 9/2014 | Harada et al. |
| 2014/0273531 A1 | 9/2014 | Niskanen et al. |
| 2015/0179427 A1 | 6/2015 | Hirose et al. |
| 2015/0243545 A1 | 8/2015 | Tang et al. |
| 2015/0255324 A1 | 9/2015 | Li et al. |
| 2016/0013042 A1 | 1/2016 | Hashimoto et al. |
| 2016/0020094 A1 | 1/2016 | Van Aerde et al. |
| 2016/0093528 A1 | 3/2016 | Chandrashekar et al. |
| 2016/0141176 A1 | 5/2016 | Van Aerde et al. |
| 2016/0276148 A1 | 9/2016 | Qian |

FOREIGN PATENT DOCUMENTS

| | | |
|---|---|---|
| EP | 0 923 113 A2 | 6/1999 |
| EP | 0 794 567 | 1/2000 |
| JP | 51-1389 | 1/1976 |

(56) References Cited

FOREIGN PATENT DOCUMENTS

| JP | 54-004066 | 1/1979 |
|---|---|---|
| JP | 60-036662 | 2/1985 |
| JP | 62-230979 | 10/1987 |
| JP | 63-3414 | 1/1988 |
| JP | 63-239811 | 10/1988 |
| JP | 63-258016 | 10/1988 |
| JP | 2-119223 | 5/1990 |
| JP | 2-122076 | 5/1990 |
| JP | 2-208293 | 8/1990 |
| JP | 07-078863 | 3/1995 |
| JP | 08-055803 | 2/1996 |
| JP | 08-088333 | 4/1996 |
| JP | 08-186081 | 7/1996 |
| JP | 08-201399 | 7/1996 |
| JP | 09-036230 | 2/1997 |
| JP | 09-162126 | 6/1997 |
| JP | 09-246498 | 9/1997 |
| JP | 10-012731 | 1/1998 |
| JP | 10-027885 | 1/1998 |
| JP | 10-050830 | 2/1998 |
| WO | WO 2014/107290 | 7/2014 |

OTHER PUBLICATIONS

Bloem, J. "High Chemical Vapour Deposition Rates of Epitaxial Silicon Layers," *J. of Crystal Growth*, vol. 18, pp. 70-76 (1973).
Bunshah et al., "Deposition Technologies for Films and Coatings: Developments and Applications," *Noyes Publications*, p. 357 (1982).
Claasen et al., "The Deposition of Silicon from Silane in a Low-Pressure Hot-Wall System," *J. of Crystal Growth*, vol. 57, pp. 259-266 (1982).
Decision on Appeal—U.S. Appl. No. 10/347,849, dated May 31, 2006, 15 pages.
Kem, W., "Advances in Deposition Processes for Passivation Films," *J. Vac. Sci. Technol.*, vol. 14, No. 5, pp. 1082-1099 (1977).
Kleijn, C.R., "A Mathematical Model of the Hydrodynamics and Gas-Phase Reactions in Silicon LPCVD in a Single-Wafer Reactor," *J. Electrochem. Soc.*, vol. 138, No. 7, pp. 2190-2200 (Jul. 1991).
Morosanu, C.E., "Thin Films by Chemical Vapor Deposition," *Elsevier*, pp. 48, 107 (1990).
Schuegraf, K.K., *Handbook of Thin-Film Deposition Processes and Techniques*, Noyes Publication, pp. 80-81, 86, 93 (1988).
Wolf et al., *Silicon Processing for the VLSI Era*, vol. 1, Lattice Press, pp. 175-182 (1986).
European Search Report dated Nov. 17, 2015 in corresponding European Patent Application No. 151547221.4.
Coffa et al., "Defectr Production and Annealing in Ion-Implanted Amorphous Silicon," Physical Review Letters, vol. 70 No. 24, pp. 3756-3759; 1993.
Lin et al., "Front-End Integration Effects on Gate Oxide Quality," Mat. Res. Soc. Symp. Proc., vol. 428, pp. 361-366.
Voutsas, "Low Temperature Polysilicon Technology for Advanced Display Systems," Shapu Giho/Sharp Technical Journal, NBo. 69, pp. 51-56; 1987.
Wu, "Suppression of the Boron Penetration Induced Dielectric Degradation by Using a Stacked-Amorphous-Silicon Film as the Gate Structure for pMOSFET," IEEE Transactions on Electron Devices, vol. 43 No. 2; pp. 303-310; 1996.

\* cited by examiner

PROCESS FOR FORMING SILICON-FILLED OPENINGS WITH A REDUCED OCCURRENCE OF VOIDS

CROSS-REFERENCE TO RELATED APPLICATIONS

This application is a continuation-in-part of U.S. patent application Ser. No. 14/335,446, filed on Jul. 18, 2014 and titled "PROCESS FOR FORMING SILICON-FILLED OPENINGS WITH A REDUCED OCCURRENCE OF VOIDS" (now U.S. Pat. No. 9,443,730). This application is also a continuation-in-part of U.S. patent application Ser. No. 14/555,379, filed on Nov. 26, 2014 and titled "PROCESS FOR FORMING SILICON-FILLED OPENINGS WITH A REDUCED OCCURRENCE OF VOIDS" (abandoned), which is a continuation-in-part of U.S. patent application Ser. No. 14/335,446, filed on Jul. 18, 2014 and titled "PROCESS FOR FORMING SILICON-FILLED OPENINGS WITH A REDUCED OCCURRENCE OF VOIDS" (now U.S. Pat. No. 9,443,730). The entire disclosures of both priority documents are incorporated by reference herein.

FIELD

This disclosure relates to semiconductor processing and, in particular, to forming silicon-filled openings having no or a low occurrence of voids in the silicon fill.

BACKGROUND

Semiconductor devices typically include openings that have been filled with polysilicon, which may form constituent parts of various electronic devices. The fill may include depositing a layer of silicon on side and bottom surfaces of the opening, with the layer filling in the opening from the sides and bottom as it grows. The growth of the layer may not be completely uniform, however, causing voids, such as seams, to form in the interior of the opening. In some cases, these voids may be caused by the deposition process, in which silicon may deposit at a higher rate at the top of the opening than at the bottom, thereby causing the top of the opening to close up first, leaving the voids in the interior of the opening.

Figure 1:
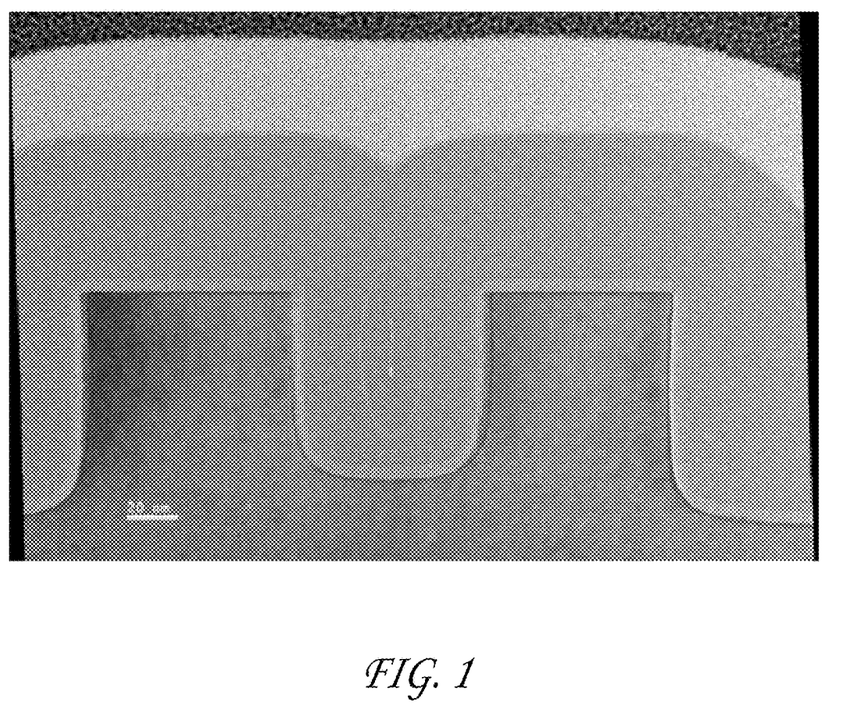
FIG. 1 shows a transmission electron micrograph (TEM) cross-section of an opening filled with an as-deposited, amorphous silicon film.

FIG. 1 shows a transmission electron micrograph (TEM) cross-section of an opening filled with an as-deposited, amorphous silicon film. As seen in the circled region at the center of the cross-section, a void, a vertically-elongated seam in this case, is present. Such voids can adversely impact the electronic devices formed by the filled opening. Accordingly, there is a need for processes for forming silicon-filled openings, while leaving no or nearly no voids in the openings.

SUMMARY

In some embodiments, a method for semiconductor processing is provided. The method includes depositing an amorphous silicon film onto a substrate at a deposition temperature in a deposition chamber. The substrate has a trench and the amorphous silicon film is deposited to a thickness sufficient to fill the trench. The deposited amorphous silicon film is exposed to an oxidizing gas, a nitriding gas, or an n-type dopant gas at a temperature of about 575° C. or below. The substrate is subsequently heated to an anneal temperature. The substrate is then maintained at the anneal temperature to crystallize the amorphous silicon film in the trench. This anneal may convert the amorphous silicon film to a polysilicon film.

In some embodiments, the deposition temperature is about 550° C. or below. The anneal temperature may be about 580° C. or higher. The substrate may be maintained at the anneal temperatures for about 30 minutes or more. In some embodiments, exposing the substrate to the n-type dopant gas comprises exposing the substrate to a phosphorus-containing gas, an arsenic-containing gas, or an antimony-containing gas.

In some other embodiments, a method for semiconductor processing is provided. The method includes depositing a silicon film on a substrate and into an opening in the substrate, thereby filling the opening. Portions of the silicon film in the opening comprises a void. The method further includes exposing a surface of the amorphous silicon film to a silicon mobility inhibitor and subsequently reducing a size of the void by annealing the silicon film.

DETAILED DESCRIPTION

One proposed approach for eliminating voids in openings filled with silicon is to perform an anneal after depositing the silicon into the openings. As used herein, the silicon in the openings may also be referred to as a silicon fill. It has been contemplated that the anneal would cause a crystallization of the silicon, along with a rearrangement or movement of the silicon atoms, thereby causing the voids or seams to disappear or be "healed."

Figure 2:
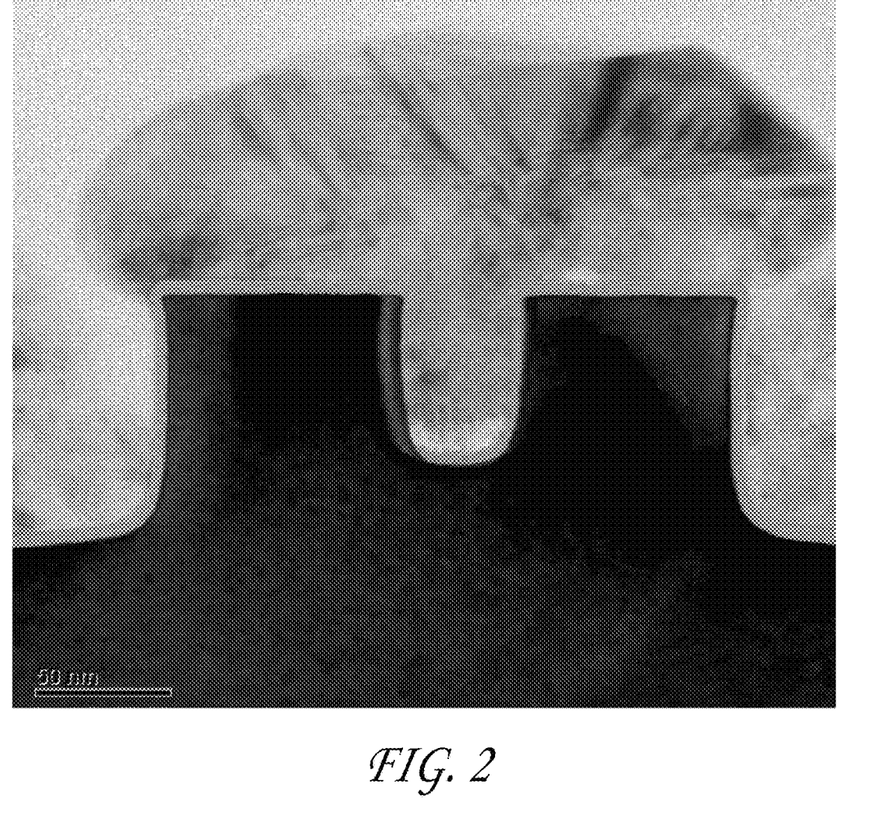
FIG. 2 shows a TEM cross-section of an as-deposited, amorphous silicon film after being annealed at 600° C.
Figure 3:
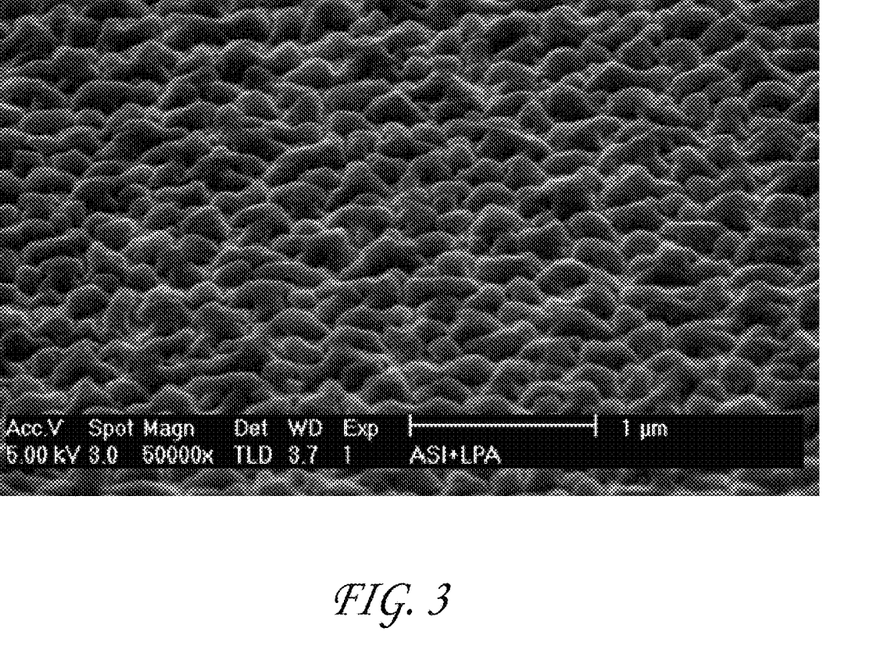
FIG. 3 shows a scanning electron micrograph (SEM) of an as-deposited, amorphous silicon film annealed at 600° C.

It has been found, however, that such an anneal produced other undesirable changes in the deposited silicon. For example, the anneal was found to cause extreme roughening of the deposited silicon. Examples of such roughening are shown in FIGS. 2 and 3. FIG. 2 shows a TEM cross-section of an as-deposited, amorphous silicon film after being annealed at 600° C. FIG. 3 shows a scanning electron micrograph (SEM) of an as-deposited, amorphous silicon film annealed at 600° C. The amorphous silicon film was deposited in a trench which was elongated in a direction extending out of the page. Although the void seems to have been eliminated in the narrowest trench, the amount of atom rearrangement and the resulting surface roughness was large. The resulting film was unsuitable for use in integrated circuit structures. Indeed, at some spots, the film completely disappeared after the anneal.

In some embodiments, silicon-filled openings are formed having no or exceptionally small voids in the silicon fill, while maintaining a smooth exposed silicon surface. In some embodiments, an opening in a substrate may be filled with silicon, which may be amorphous silicon. In some embodiments, the silicon fill may include a plurality of deposited layers (e.g., including a doped silicon layer), with a final, top layer of amorphous silicon completing the fill of the opening. The silicon in the openings may have voids, such as seams, which may be, e.g., near the center of the openings. Consequently, the voids may be closed volumes in the interior of the opening. The silicon fill is exposed to a silicon mobility inhibitor and is subsequently annealed. Advantageously, after the anneal, the voids may be reduced in size and, in some embodiments, this reduction in size may occur to such an extent that the voids are eliminated. Additionally, the anneal may crystallize amorphous silicon by converting the amorphous silicon to a more crystalline form of silicon, e.g., to polysilicon. In some embodiments, the anneal may convert the amorphous silicon fill to a polysilicon fill.

Without being limited by theory, the silicon mobility inhibitor is believed to interact with exposed silicon to limit the movement of silicon atoms. Advantageously, the natural pinching behavior in some depositions, which can cause the formation of voids, also prevents or limits the movement of the mobility inhibitor into the voids. As a result, silicon atoms in the interiors of the filled openings are relatively free to move and to rearrange during an anneal, while the silicon atoms on the exposed surface are limited in their movements by the exposure to the mobility inhibitor. Advantageously, this difference in movement of silicon atoms allows the voids to be eliminated or reduced without roughening the exposed surface. Thus, the exposed surface remains substantially as smooth as it was immediately after being deposited.

Examples of silicon mobility inhibitors include oxygen-containing chemical species, for example oxidizing species such as oxygen ($O_2$) and oxygen-containing compounds, including NO, $N_2O$, $NO_2$, $CO_2$, $H_2O$, and alcohols. In some embodiments, the mobility inhibitor may be a semiconductor dopant such as $PH_3$, $AsH_3$, and $SbH_3$. In some embodiments, the mobility inhibitor may be a nitriding species, e.g., $NH_3$. In some embodiments, combinations of the above noted mobility inhibitors may be utilized.

Figure 4:
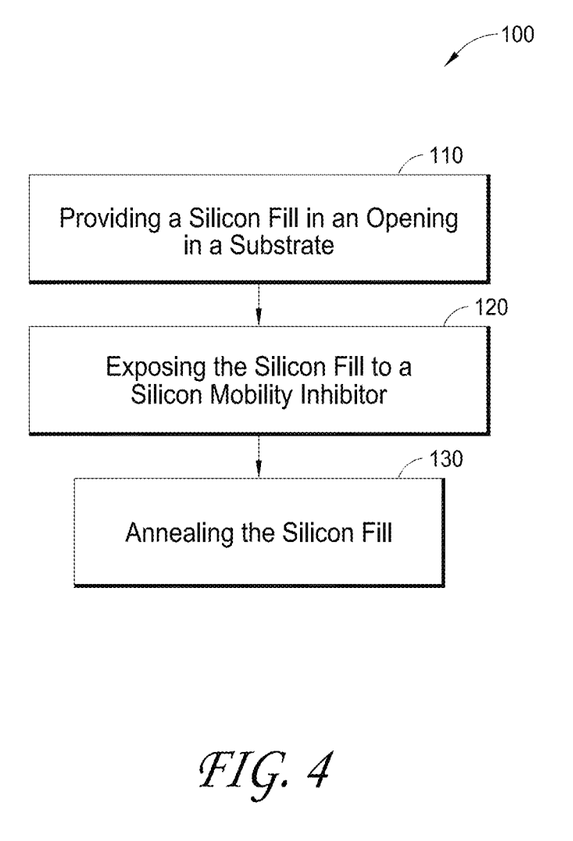
FIG. 4 is a flowchart illustrating a method of reducing voids or seams in the silicon-filled opening.

With reference now to the drawings, FIG. 4 is a flowchart illustrating a method of reducing voids or seams in a silicon-filled opening. The method 100 includes providing 110 a silicon fill in an opening in a substrate, exposing 120 that silicon fill to a silicon mobility inhibitor, and annealing 130 the silicon fill by subjecting the substrate to an anneal. The anneal may reduce or eliminate voids in the silicon fill. In some embodiments where the silicon fill is amorphous silicon, the anneal may both reduce or eliminate voids in the silicon fill, and also crystallize the silicon fill. It will be appreciated that the opening may be part of a semiconductor substrate such as a silicon wafer. As an example, the substrate may include a layer of material, e.g., a dielectric layer, in which the opening is disposed. In some embodiments, the opening may be an elongated trench. In some embodiments, the opening may have a width of about 100 nm or less (e.g., about 100 nm to about 5 nm), about 50 nm or less (e.g., about 50 nm to about 5 nm), or about 20 nm or less (e.g., about 20 nm to about 8 nm).

With continued reference to FIG. 4, providing 110 may simply include receiving a substrate, having openings filled with silicon, for subsequent process blocks 120 and 130. In some other embodiments, providing 110 the opening filled with silicon may include depositing silicon into the opening. For example, a silicon film may be deposited and grown in the opening. In some embodiments, the deposited film may be an as-deposited polysilicon film. Preferably, the polysilicon film is not doped with a surface mobility inhibitor, such as an n-type dopant (including, phosphorus, arsenic or antimony).

In some other embodiments, the silicon film is deposited under conditions that form an amorphous silicon film. For example, the deposition temperature may be sufficiently low that the silicon film grows in the amorphous state. In some embodiments, the deposition temperature is about 550° C. or less (e.g., about 550° C. to about 480° C.), about 530° C. or less (e.g., about 530° C. to about 485° C.), or about 510° C. or less (e.g., about 510° C. to about 490° C.). Such amorphous silicon films may be deposited with higher step coverage than as-deposited, polycrystalline silicon films, thereby providing smaller voids and facilitating a faster void removal in later blocks 120 and 130. An example of a process for the deposition of the amorphous silicon film has the following conditions:

Silicon source: $SiH_4$
$SiH_4$ flow rate: 660 sccm
Pressure: 500 mTorr
Temperature: 520° C.

As evident from the above, the amorphous silicon film does not contain a surface mobility inhibitor.

In addition to $SiH_4$, other non-limiting examples of silicon sources or precursors for depositing the silicon film in the opening include silanes generally, such as disilane, trisilane, or chlorosilanes.

With continued reference to FIG. 4, in some embodiments, providing 110 can include providing a silicon fill that incorporates a mobility inhibitor, for example, an electrical dopant such as phosphorus or arsenic. It has been found, however, that simply filling an opening with doped silicon does not allow successful healing of voids in the silicon fill. For example, it has been found that voids in a phosphorus-doped silicon fill are not healed after being annealed (such as an anneal in a subsequent block 130, discussed below). Without being limited by theory, the phosphorus present in the doped fill and on the surfaces of the voids is believed to cause such an inhibition of surface diffusion of the silicon atoms that insufficient rearrangement takes place and healing of the voids is not successfully accomplished.

In some embodiments, providing 110 includes filling the opening with a plurality of layers of material, with the final layer filling the opening being an amorphous silicon layer. For example, the opening may be partially filled with a silicon layer, such as an amorphous silicon layer what contains a mobility inhibitor, the layer having a thickness that is insufficient to completely fill an entire volume of the trench, leaving open an upper portion of the trench near the top of the trench in some embodiments. In some embodiments, the mobility inhibitor is an electrical dopant, such as phosphorus or arsenic. The amorphous silicon layer may be doped by various methods, including, for example, as-deposited doping. The trench is subsequently filled with an undoped amorphous silicon layer such that the trench is filled in and the top of the trench is closed. In some embodiments, the undoped amorphous silicon film has a thickness of about 5 nm or more, or 10 nm or more, which can facilitate having a sufficient quantity of material to rearrange and heal voids in the filled opening, during a subsequent anneal, as discussed herein.

It will be appreciated that silicon film deposited into the opening will fill the opening by growing on the sides and bottoms of the opening. The growth may be uneven and voids may be formed, e.g., along the centerline of the opening where films growing on opposing sides of the opening converge. For example, without being limited by theory, opposing portions of the film at upper portions of the opening, near the mouth of the opening, may converge first. This may block off further deposition in lower portions of the opening, thereby causing voids to form in the silicon fill. Thus, the filled opening may be closed at its mouth by the silicon film, but have voids in its interior.

With continued reference to FIG. 4, these voids may be eliminated or reduced in size by exposing 120 the silicon fill to a silicon mobility inhibitor and a subsequent anneal 130. It will be appreciated that the silicon mobility inhibitor is a chemical species that interacts with the exposed surface of the silicon fill to stabilize or limit the movement of silicon atoms on that surface. In some embodiments, the silicon mobility inhibitor maintains the roughness of the surface at substantially the same level after the anneal 130 as before that anneal. For example, the surface roughness after the anneal 130 may be within about 10 Å, within about 5 Å, or within about 3 Å of the surface roughness before the anneal 130. Non-limiting examples of silicon mobility inhibitors include oxygen containing species including oxidizing species such as oxygen ($O_2$) and oxygen-containing compounds, such as NO, $N_2O$, $NO_2$, $CO_2$, $H_2O$, and alcohols; nitriding species such as $NH_3$, and semiconductor dopants such as $PH_3$ and $AsH_3$. In some embodiments, combinations of oxygen-containing chemical species, nitriding species, and/or semiconductor dopants may be utilized.

In some embodiments, exposing 120 the silicon fill to the silicon mobility inhibitor may include introducing the silicon mobility inhibitor into a process chamber containing the substrate with the silicon fill. For example, the silicon mobility inhibitor may be flowed into the process chamber as a gas. In some embodiments, the process chamber is the same chamber in which the silicon fill was deposited. In some other embodiments, the substrate is removed from the deposition chamber for exposure to the silicon mobility inhibitor. For example, exposing 120 the silicon fill to the silicon mobility inhibitor may include exposing the silicon fill to the ambient air during transport from the deposition chamber to an anneal chamber for annealing 130 the silicon fill. In some embodiments, the deposition and anneal are performed in the same process chamber and exposure to the silicon mobility inhibitor may be accomplished by unloading the substrate to expose it to air and then reloading the substrate into the process chamber. In some embodiments, depositing the silicon fill, exposing the silicon fill to the silicon mobility inhibitor, and annealing the silicon fill are all performed in the same process chamber without unloading the substrates from the process chamber in between any of these depositing, exposing, and unloading steps.

In some embodiments, the exposure to the silicon mobility inhibitor is performed at a temperature that is lower than a temperature at which the silicon atoms at the surface of the silicon fill become mobile and rearrange. As noted herein, annealing the silicon fill without exposure to the silicon mobility inhibitor can increase the roughness of the deposited silicon. To guard against such roughening, in some embodiments, the substrate is not heated above 575° C. until after exposure to the mobility inhibitor. In some embodiments, the exposure is performed at the deposition temperature. In some other embodiments, the exposure is performed at least partly during heating of the substrate from the deposition temperature to the anneal temperature, provided that the exposure starts at a temperature lower than 575° C.

It will be appreciated that the duration of the exposure is sufficient for the mobility inhibitor to interact with the surface of the silicon fill to prevent roughening of that surface. In some embodiments, the exposure occurs for a duration of about 1 minute or more. In some embodiments, a thin layer (e.g., a monolayer or less) of the mobility inhibitor is deposited by the exposure.

With continued reference to FIG. 4, the silicon fill is annealed at block 130 after being exposed at block 120 to the silicon mobility inhibitor. In some embodiments, the substrate may be transported to a dedicated anneal chamber to perform the anneal. In some other embodiments, the anneal may be performed in the same chamber in which the silicon fill was deposited.

The anneal temperature is generally higher than the deposition temperature and causes silicon atoms in the silicon fill to move, thereby eliminating or reducing the sizes of voids in the silicon fill. In some embodiments, the anneal temperature is about 580° C. or higher (e.g., including about 580° C. to about 900° C.), about 600° C. or higher (e.g., including about 600° C. to about 850° C.), or about 700° C. or higher (e.g., including about 700° C. to about 800° C.). In some embodiments, the duration of the anneal is about 30 minutes or more, or about 60 minutes or more. Advantageously, voids in the silicon fill are not observable or made nearly undetectable by visual inspection after the anneal, while the surface of the deposited silicon remains substantially as smooth as it was before the anneal. In addition, the anneal can advantageously crystallize the amorphous silicon.

With reference again to FIG. 4, in some embodiments, after filling 110 of the trench by deposition of an amorphous silicon layer, and before annealing 130 at the anneal temperature, the amorphous silicon layer is patterned. For example, the amorphous carbon layer may be patterned by forming a patterned mask over the amorphous silicon layer and etching the amorphous silicon layer through the mask to transfer the pattern in the mask to the amorphous silicon layer. Patterning the amorphous silicon layer before an anneal and crystallization of the silicon layer has the advantage that etching the lines in an amorphous layer results in a lower Line Edge Roughness than etching the lines in a polycrystalline layer. In some embodiments, the patterning process may comprise exposing the top surface and side surfaces of the lines in the amorphous silicon layer to a silicon mobility inhibiting gas, e.g., simultaneously with removing an etch mask. In some other embodiments, exposure to the mobility inhibiting gas is performed after patterning, or defining, the lines and before the anneal at the anneal temperature. As discussed herein, preferably, the exposure to the silicon mobility inhibiting gas, during or after the patterning process, is performed at a temperature of 575° C. or below (e.g., about 550° C. to about 480° C.).

With continued reference to FIG. 4, in some embodiments, before start of the deposition of the amorphous silicon film to fill 110 the trench, the trench is exposed to a nucleation enhancing chemical species, e.g., in a nucleation step, to enhance the nucleation of the subsequently-deposited amorphous silicon layer. In some embodiments, the nucleation enhancing chemical species includes one or more of a silicon-containing species, a germanium-containing species, a nitrogen-containing species, and a boron-containing species. Non-limiting examples of nucleation enhancing gases include one or more gases selected from the group of $BCl_3$, $B_2H_6$, $NH_3$, $N_2H_4$, $SiCl_4$, $SiHCl_3$, $SiH_2Cl_2$, $SiH_3Cl$, $SiH_4$, $Si_2H_6$, $Si_3H_8$, $GeCl_4$, $GeHCl_3$, $GeH_2Cl_2$, $GeH_3Cl$, and $GeH_4$. Preferably, the substrate and trench is exposed to the nucleation enhancing chemical species under conditions that promote nucleation, and the nucleation enhancing chemical species is adsorbed on the surfaces of the trench to form nucleation sites for the subsequent deposition of the amorphous silicon layer. In some embodiments, conditions of the nucleation step for the nucleation enhancing chemical species include: a duration of the exposure to the nucleation enhancing gas of between 0.1 min and 30 min, preferable between 0.5 and 10 min; a pressure between 10 m Torr and 10 Torr, preferably about 1 Torr; and a gas flow rate, of the nucleation enhancing gas into the deposition chamber, of between 1 sccm and 1 slm, preferably between 10 sccm and 100 sccm. After the nucleation step, in some embodiments, the deposition of an amorphous silicon layer is performed at conditions that are favorable for conformal filling of the trench.

EXAMPLES

Various Figures discussed below document experiments for forming silicon-filled openings with no or very small voids. The deposition and anneal processes were performed in an A412™ vertical furnace available from ASM International N.V. of Almere, the Netherlands. The furnace has a process chamber that can accommodate a load of 150 semiconductor substrates, or wafers, having a diameter of 300 mm, with the substrates held in a wafer boat.

Figure 5A:
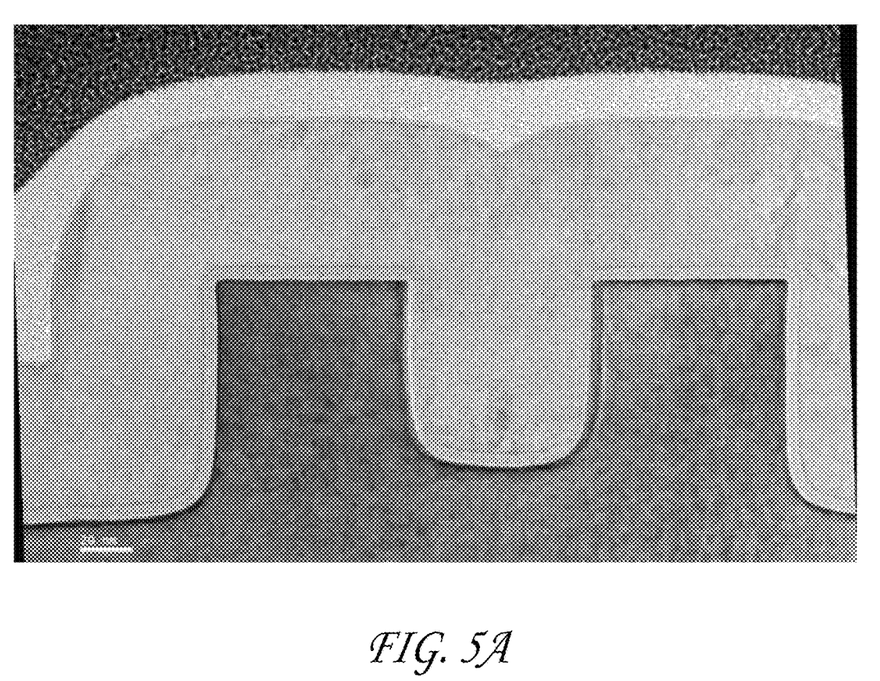
FIGS. 5A, 5B, and 5C show, respectively, TEM cross-sections of openings filled with an amorphous silicon film, after being exposed to oxygen and annealed at atmospheric pressure at A) 600° C., for 240 minutes; B) 700° C., for 120 minutes; and C) 800° C., for 60 minutes.
Figure 5B:
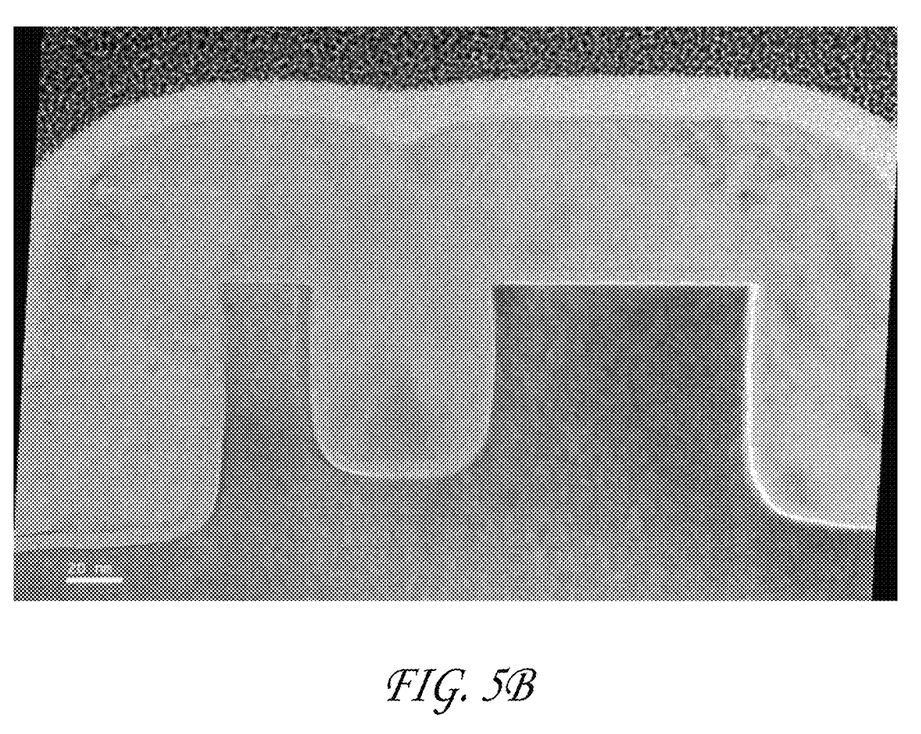
Figure 5C:
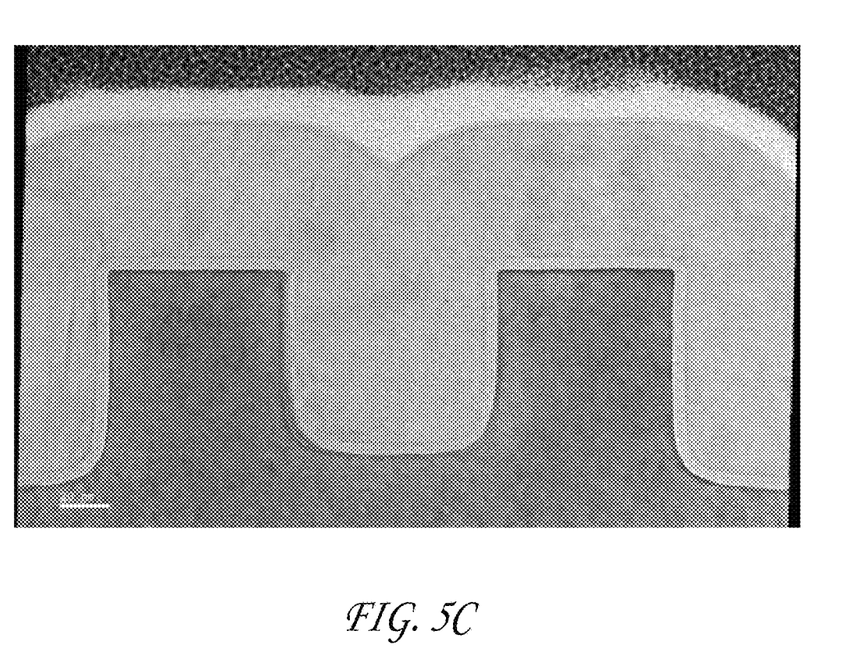

FIGS. 5A, 5B, and 5C show, respectively, TEM cross-sections of openings filled with an amorphous silicon film, after being exposed to oxygen and annealed at atmospheric pressure at A) 600° C., for 240 minutes; B) 700° C., for 120 minutes; and C) 800° C., for 60 minutes. The amorphous silicon film was deposited into trenches having widths of about 40 nm to about 80 nm under the following conditions:

Silicon source: $SiH_4$
$SiH_4$ flow rate: 660 sccm
Pressure: 500 mTorr
Temperature: 520° C.

After the deposition, as noted above, the substrates were unloaded from the deposition furnace and transported to an anneal furnace where they were annealed in $N_2$ at atmospheric pressure at the following conditions: A) 600° C., 240 min; B) 700° C., 120 min; and C) 800° C., 60 min. The substrates are exposed to oxygen in the atmospheric air during transport from the deposition furnace to the anneal furnace. Desirably, no voids or seams are visible in the silicon fill in any of FIG. 5A, 5B, or 5C.

Figure 6:
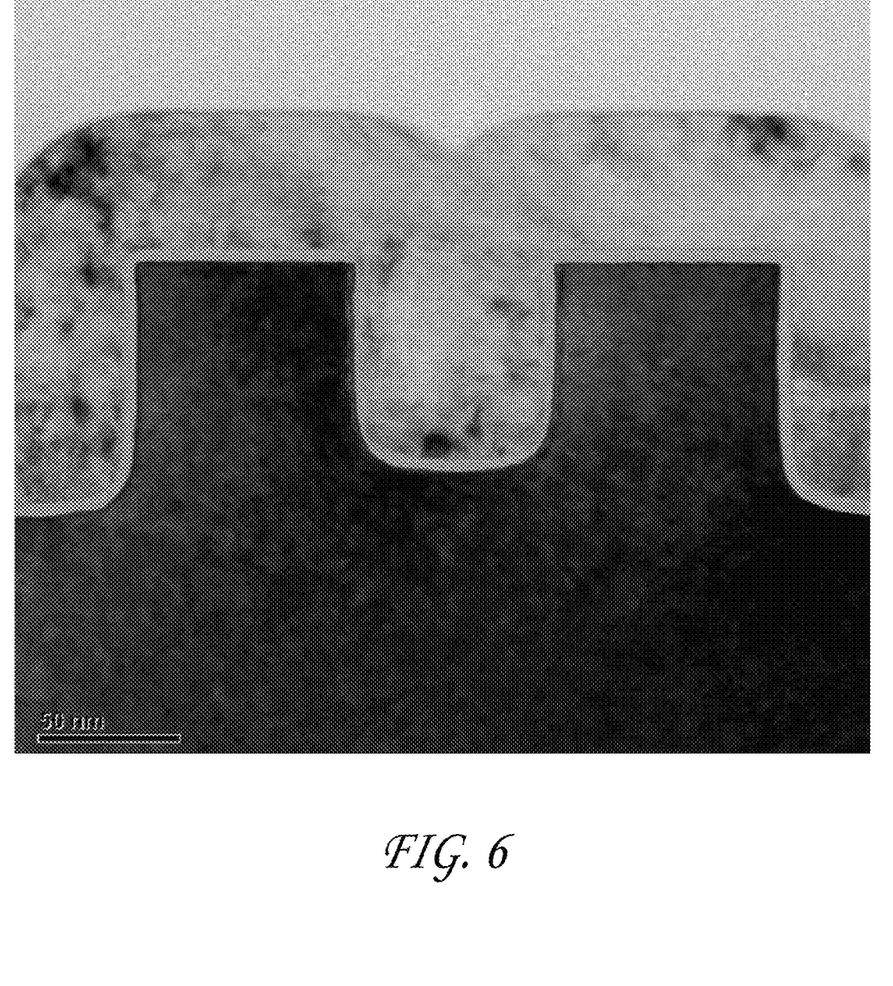
FIG. 6 shows a TEM cross-section of an opening filled with an amorphous silicon film, after being exposed to oxygen and annealed at 500 mTorr and 600° C. for 240 minutes.

FIG. 6 shows a TEM cross-section of an opening filled with an amorphous silicon film, after being exposed to oxygen and annealed at 500 mTorr and 600° C. for 240 minutes. The silicon film was deposited as noted above with respect to FIGS. 5A, 5B, and 5C. After depositing the silicon film, the substrates are exposed to oxygen by being unloaded from the deposition furnace. The substrates were unloaded into an $N_2$ mini-environment with about 10 ppm $O_2$ and then re-inserted in the deposition furnace again to perform the anneal. The anneal was performed at 600° C. for 240 min and at a pressure of 1 Torr. The surface of the deposited films remained smooth and the voids or seams that were present were healed and could not be observed anymore. Thus, it was found that the residual oxygen concentration of about 10 ppm or more in the $N_2$ mini-environment was sufficient to stabilize the surface of the silicon fill. In another experiment, with all of the other conditions being the same, the anneal was performed at a pressure of 150 Torr and the same result was observed.

Unloading substrates from the deposition chamber may be time consuming. In some experiments, the amorphous silicon film was deposited and annealed under conditions similar to those above. However, substrates were not removed from the deposition chamber during the exposure to a mobility inhibitor. Rather, the amorphous silicon film was exposed to $PH_3$ (1% in $N_2$ or $H_2$), which was flowed into the deposition chamber at a flow rate of 66 sccm, with the deposition pressure at 200 mTorr and deposition temperature at 520° C. The silicon film was exposed to the $PH_3$ for 10 minutes. It was found that this exposure was effective in substantially completely suppressing surface roughening during a subsequent anneal, while also eliminating voids in the silicon fill. It is contemplated that similar results may be achieved by exposing the amorphous silicon film in-situ (in the deposition chamber) to a flow of oxygen for, e.g., 1 minute or more.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for semiconductor processing, comprising:
depositing an amorphous silicon film onto a substrate at a deposition temperature in a deposition chamber, the substrate having a trench with a trench opening and the amorphous silicon film having a thickness sufficient to fill the trench and to pinch off the trench opening;
exposing portions of the amorphous silicon film to an oxidizing gas, a nitriding gas, or an n-type dopant gas at a temperature of about 575° C. or below;
subsequently heating the substrate to an anneal temperature, wherein exposing the portions of the amorphous silicon film inhibits movement of silicon atoms of the exposed portions of the amorphous silicon film during heating the substrate while allowing relatively freer movement of silicon atoms of portions of the amorphous silicon film defining closed voids in the trench; and
maintaining the substrate at the anneal temperature to crystallize the amorphous silicon film in the trench.

2. The method of claim 1, wherein exposing the amorphous silicon film to the n-type dopant comprises exposing the amorphous silicon film to a phosphorus-containing gas, an arsenic-containing gas, or an antimony-containing gas.

3. The method of claim 1, further comprising, before depositing the amorphous silicon film:
forming a doped silicon film in the trench, the doped silicon film occupying less than an entire volume of the trench,
wherein depositing the amorphous silicon film comprises depositing the amorphous silicon film in a remaining open portion of the volume, and wherein the amorphous silicon film is undoped.

4. The method of claim 3, wherein the doped silicon film is doped with arsenic or phosphorus.

5. The method of claim 3, wherein the amorphous silicon film has a thickness of about 5 nm or more.

6. The method of claim 1, further comprising, before depositing the amorphous silicon film:
exposing the trench to a nucleation enhancing chemical species.

7. The method of claim 6, wherein the nucleation enhancing chemical species comprises a silicon-containing species.

8. The method of claim 6, wherein the nucleation enhancing chemical species comprises a germanium-containing species.

9. The method of claim 6, wherein the nucleation enhancing chemical species comprises a nitrogen-containing species.

10. The method of claim 6, wherein the nucleation enhancing chemical species comprises a boron-containing species.

11. The method of claim 6, wherein the nucleation enhancing chemical species comprises one or more chemical species selected from the group of $BCl_3$, $B_2H_6$, $NH_3$, $N_2H_4$, $SiCl_4$, $SiHCl_3$, $SiH_2Cl_2$, $SiH_3Cl$, $SiH_4$, $Si_2H_6$, $Si_3H_8$, $GeCl_4$, $GeHCl_3$, $GeH_2Cl_2$, $GeH_3Cl$, and $GeH_4$.

12. The method of claim 1, wherein maintaining the substrate at the anneal temperature is performed for a duration of about 30 minutes or more.

13. The method of claim 1, wherein the anneal temperature is about 580° C. or higher.

14. The method of claim 1, wherein the deposition temperature is about 550° C. or lower.

15. The method of claim 1, wherein the anneal temperature is about 580° C. or higher.

16. The method of claim 15, wherein the anneal temperature is about 600° C. or higher.

17. The method of claim 1, wherein exposing the amorphous silicon film to the oxidizing gas comprises unloading the substrate from the deposition chamber, thereby exposing the substrate to an ambient atmosphere outside the deposition chamber.

18. The method of claim 17, wherein exposing the amorphous silicon film to the oxidizing gas further comprises transporting the substrate from the deposition chamber to an anneal chamber for heating the substrate to the anneal temperature.

19. The method of claim 17, further comprising reloading the substrate into the deposition chamber, wherein heating the substrate to the anneal temperature and maintaining the substrate at the anneal temperature is performed in the deposition chamber.

20. The method of claim 1, wherein exposing the amorphous silicon film to the oxidizing gas, the nitriding gas, the phosphorus-containing gas, or the arsenic-containing gas comprises flowing the oxidizing gas, the nitriding gas, the phosphorus-containing gas, or the arsenic-containing gas into the deposition chamber.

21. The method of Application 1, wherein exposing the amorphous silicon film, heating the substrate to the anneal temperature, and maintaining the substrate at the anneal temperature is performed in the deposition chamber without unloading the substrates from the deposition chamber between any of depositing the amorphous silicon film and exposing the amorphous silicon film, exposing the amorphous silicon film and heating the substrate, and heating the substrate and maintaining the substrate at the anneal temperature.

22. The method of claim 1, wherein exposing the amorphous silicon film to the oxidizing gas is performed for 1 minute or more.

23. The method of claim 1, wherein the deposition chamber is a process chamber of a batch furnace.

24. The method of claim 1, wherein maintaining the substrate at the anneal temperature converts the amorphous silicon film in a polysilicon film.

25. The method of claim 1, further comprising patterning the amorphous silicon film before exposing the amorphous silicon film to an oxidizing gas.

26. The method of claim 1, wherein a roughness of an exposed surface of the silicon film is within about 10 Å of a roughness of the exposed silicon film before annealing the silicon film.

* * * * *

UNITED STATES PATENT AND TRADEMARK OFFICE
CERTIFICATE OF CORRECTION

PATENT NO. : 9,837,271 B2  
APPLICATION NO. : 14/941322  
DATED : December 5, 2017  
INVENTOR(S) : Van Aerde et al.

Page 1 of 1

It is certified that error appears in the above-identified patent and that said Letters Patent is hereby corrected as shown below:

On the Title Page

In Column 2 (page 3, item (56)) at Line 19, Under Other Publications, change "Defectr" to --Defect--.

In the Claims

In Column 10 at Line 15, In Claim 21, change "Application" to --claim--.

Signed and Sealed this
Seventeenth Day of April, 2018

Andrei Iancu
*Director of the United States Patent and Trademark Office*